United States Patent [19]

Bethsold

[11] 3,778,883

[45] Dec. 18, 1973

[54] PROCESS OF MASS SOLDERING ELECTRICAL COMPONENTS TO CIRCUIT BOARDS HAVING RUNS FORMED FROM INSULATED MAGNET WIRE

[75] Inventor: Karl R. Bethsold, Phoenix, Ariz.

[73] Assignee: Honeywell Information Systems Inc., Waltham, Mass.

[22] Filed: June 2, 1972

[21] Appl. No.: 260,337

[52] U.S. Cl. ........................ 29/495, 29/498, 29/503, 29/628, 228/37

[51] Int. Cl. ........................ B23k 31/02, B23k 35/36

[58] Field of Search ........................ 29/503, 92, 628, 29/495, 498; 219/92; 228/36, 37

[56] References Cited

UNITED STATES PATENTS

| | | | |
|---|---|---|---|
| 3,100,471 | 8/1963 | Gutbier | 29/503 X |
| 3,353,263 | 11/1967 | Helms | 29/628 X |
| 3,448,431 | 6/1969 | Adrien | 29/628 UX |
| 3,482,755 | 12/1969 | Routi | 29/503 X |
| 3,604,611 | 9/1971 | Lomberty | 228/36 |
| 3,673,681 | 7/1972 | Steranko | 29/628 X |
| 3,386,166 | 6/1968 | Tardoskegyi | 29/495 X |

FOREIGN PATENTS OR APPLICATIONS

| | | | |
|---|---|---|---|
| 525,597 | 8/1940 | Great Britain | 29/628 |

*Primary Examiner*—J. Spencer Overholser
*Assistant Examiner*—Ronald J. Shore
*Attorney*—James A. Pershon et al.

[57] ABSTRACT

The soldering process uses eutectic solder raised to a higher than normal temperature for printed circuit board soldering. The higher temperature is used to remove the insulation from the wire to allow the solder to electrically fasten the wire and the components to the circuit boards. The process immerses the circuit board into the molten solder for a specific dwell time according to the temperature of the solder, the circuit board material and the insulation to be removed from the wire. The dwell time and solder bath temperature must fall within a determined operating range to remove the insulation from the wire and perform the soldering while preventing damage to the board.

3 Claims, 11 Drawing Figures

PROCESS OF MASS SOLDERING ELECTRICAL COMPONENTS TO CIRCUIT BOARDS HAVING RUNS FORMED FROM INSULATED MAGNET WIRE

BACKGROUND OF THE INVENTION

This invention relates generally to a mass soldering process and more particularly to high-temperature mass soldering of insulated magnet wire to circuit boards.

In prior art soldering processes for printed circuit boards, the temperature of the solder bath for the mass soldering was kept at a temperature slightly higher than the molten point in order to keep the damage to the board and the electrical components to a minimum. A prior art process dipped the printed circuit board into the molten solder and kept the circuit board into the bath until all of the connections became saturated with solder.

A low-cost method of manufacturing printed circuit boards is now being developed by the use of insulated wire sewn into pads formed on printed circuit boards to form the interconnecting lines or "runs" of the printed circuit board. The circuit board for use with the present process is disclosed and claimed in a U.S. Pat. No. 3,646,246, issued on Feb. 29, 1972 and assigned to the same assignee as the present invention. This patent discloses a printed circuit board with the completely insulated wire sewn or stitched into the pads of the printed circuit board. Holes can be drilled into the pads for ease of sewing. A thread or other insulative nonpermanent material forms the other half of the stitch to hold the wire into engagement with the pads. The wire generally requires a high temperature in excess of 600°F to remove the insulation, such as polyurethane, from the wire while soldering the wire into place to the plated holes in the pads on the printed circuit board. The low temperature used in prior art printed circuit board soldering is completely unusable for removal of the insulation from the polyurethane-coated wire because of the length of time that the circuit board would have to remain in the solder bath.

The use of a high temperature in the order of in excess of 600°F causes other problems such as the burning of the laminates comprising the circuit board and the lifting of the copper plated pads from the surface of the printed circuit board if the board is left in contact with the solder for too long a time. A solder with a higher percentage of tin in the tin-lead composition than eutectic solder is usable at the very high temperature, but the high percentage of tin causes other problems. Some of these problems are the residual bridging characteristic of the high tin content solder, the high tin oxide formations on the molten solder, and the plastic state that the high tin content solder passes through before hardening.

In order to get away from the problems involved in the use of a high temperature soldering process for what would seemingly be a more economical method of mass production of circuit boards, most innovations developed are directed towards a soldering process with individual tips placed at a high temperature in excess of 600°F. Various tip designs and multiple tips are presently being used to remove the insulation from the polyurethane-coated wire and solder the connection. The individual tips help prevent raising the temperature of the circuit board material in excess of that which might damage the board.

SUMMARY OF THE INVENTION

The problems of the prior art are solved by providing a mass soldering process for special printed circuit boards with interconnecting runs made from insulated wire using an eutectic solder raised to a temperature much higher than the melting point of the solder, the temperature being sufficient to remove insulation from the wire, and then controlling the time that the printed circuit board is placed into the soldering process to solder the wires to copper placed pads on the board without damaging the boards.

The process according to the present invention can be used on any type of mass soldering equipment. The temperature of the solder and the length of time that the board is contacted by the solder is determined experimentally by the time and temperature necessary to remove the insulation from the wire and the time and temperature necessary to prevent damage to the printed circuit board.

The process according to the present invention comprises the steps of determining the range of solder temperature and time for contact of the insulated-wire circuit board with the molten solder to remove the insulation from the wire without damaging the board, heating eutectic solder to the temperature falling within the determined range, prefluxing the board, placing the board in contact with the molted solder, removing the board from the molten solder after the passage of the length of time determined by the solder temperature to fall within the determined range, and cooling the board to harden the solder.

In one embodiment, a dip solder machine, the process for mass soldering of insulated-wire printed circuit boards according to the present invention would entail the steps of setting the controls to heat the eutectic solder to a temperature within the range determined by the experimentation, setting the dwell time control to fall within the acceptable range according to the experimentation, prefluxing the printed circuit board, placing the circuit board in a fixture for usage in the dip solder machine, placing the fixture into the dip solder machine holder, preheating the printed circuit board, skimming the dross from the molten solder, cycling the machine, cooling the board, removing the fixture having the board attached thereto, further cooling the printed circuit board to ambient temperature, removing the board from the fixture, and cleaning the printed circuit board.

The processes according to the present invention for use with the dip solder machine include: prefluxing the insulated-wire circuit board, placing the board into the dipping machine, preheating the board, lowering the board into the solder bath containing eutectic solder at a temperature within a "window" determined by experimentation, entering the board into the bath, leaving the board in the bath for a length of time determined by the temperature of the molten solder to be within the window, removing the board from the solder bath, cooling the board to harden the solder, and cleaning the board.

For a wave soldering machine for mass soldering the insulated wire printed circuit boards, the process would require the steps of: heating the solder to a temperature within a "window" range determined by experimentation, determining the solder wave height and entering and leaving angle of the printed circuit board into the solder wave, setting the conveyor speed of the wave soldering machine to place the printed circuit board into the solder for the desired dwell time according to the solder temperature to fall within the window range determined by experimentation, placing the board in a fixture for the solder wave machine, placing the fixture on the conveyor, cycling the printed circuit board through a machine operation, cooling the board to ambient temperature, and cleaning the printed circuit board.

Thus the necessary steps for a wave solder process according to the present invention are to heat the solder to the correct temperature, set the conveyor speed, place the board into the wave soldering machine, preflux the board, preheat the board, pass the board through the wave solder for the length of time determined by the conveyor speed, and remove the board from the machine to cool.

It is, therefore, an object of the present invention to provide an enhanced provess for mass soldering insulated-wire printed circuit boards.

It is another object of the present invention to provide an enhanced process for mass soldering printed circuit boards which requires the removal of insulation from magnet wire while soldering the wires to the printed circuit board without damage to the printed circuit board.

It is yet another object to provide a process for mass soldering printed circuit boards to remove insulation from magnetic wire while soldering the magnet wire to the printed circuit board by the use of eutectic solder raised to a higher than normal printed circuit board soldering temperature while controlling the length of time required for the solder process.

It is a further object to provide a mass soldering process which uses eutectic solder raised to a higher than normal temperature to remove the insulation from magnet wire to solder the magnet wire to the printed circuit board and experimentally determining the length of time necessary to remove the insulation from the magnet wire and solder the magnet wire to the printed circuit board without damage to the printed circuit board.

These and other objects of the present invention become apparent to those skilled in the art as the description proceeds.

BRIEF DESCRIPTION OF THE DRAWING

Further features and a more specific description of an illustrated embodiment of the invention are presented hereinafter with reference to the accompanying drawing, wherein.

DESCRIPTION OF THE PREFERRED EMBODIMENT

The description of the preferred mass soldering embodiments for mass soldering insulated-wire printed circuit boards according to the present invention will proceed after a discussion of the necessary solder temperature and immersion time of the printed circuit board into the molten solder to allow for removal of the insulation from the wire without causing damage to the printed circuit board material. The insulated wire printed circuit boards are printed circuit boards having plated component mounting "pads" with insulated wire "runs" interconnecting the pads.

Figures 1, 3, 4:
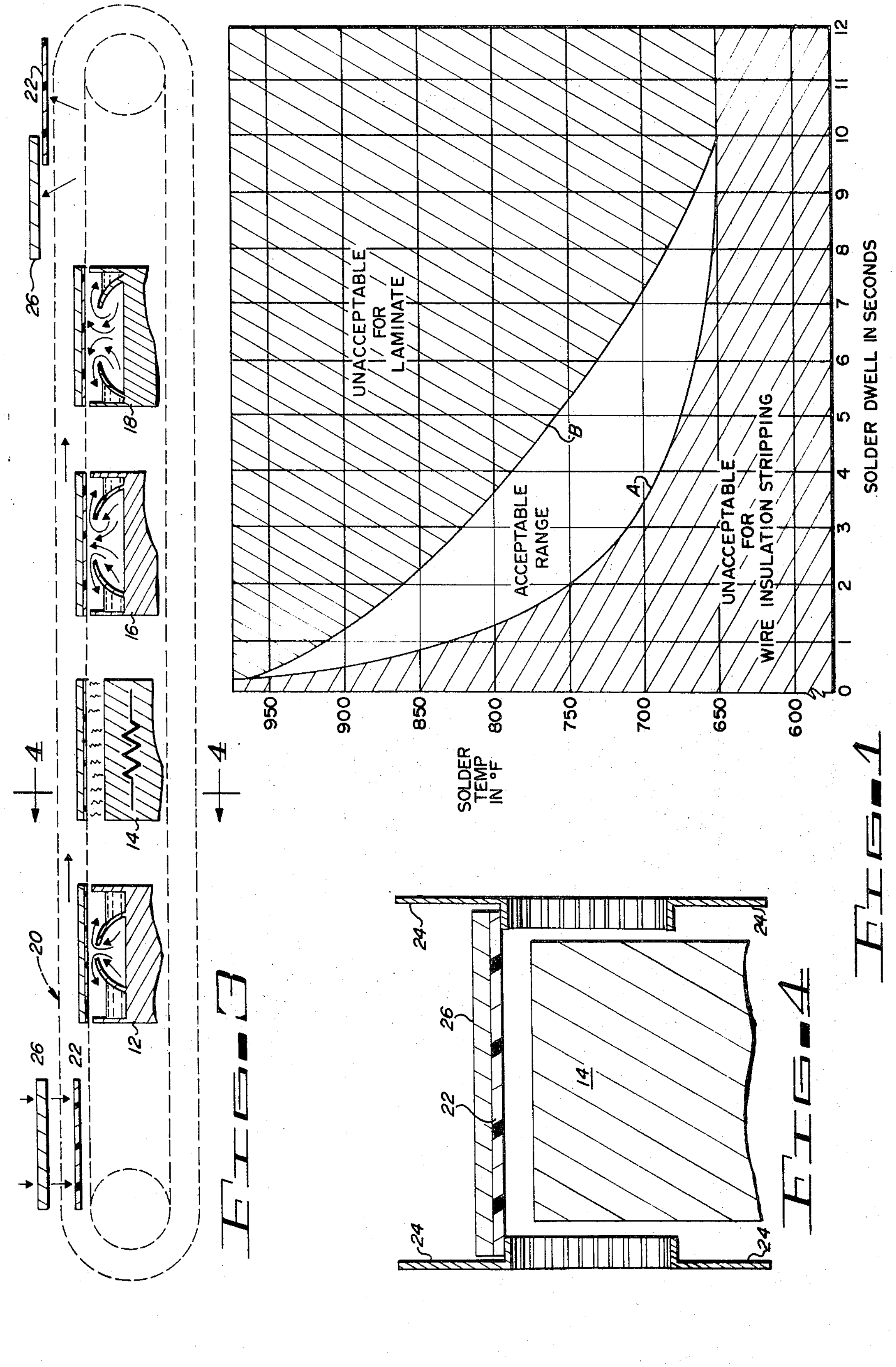
FIG. 1 is a graph of solder temperature and solder dwell time for the acceptable window range for the process according to the present invention.
FIG. 3 shows a wave soldering process for mass soldering according to the present invention by the use of a wave soldering machine.
FIG. 4 is a cross-sectional view of the wave soldering machine taken along line 4—4 of FIG. 3 and shows the placement of the printed circuit board in the machine.

In FIG. 1, a graph is shown of solder temperature versus dwell time. The length of solder dwell time in seconds that the printed circuit board is held into contact with the molten solder is plotted on the abscissa or horizontal coordinate of the graph. The temperature of the molten solder is plotted on the ordinate or vertical direction of the graph. The solder temperature is shown in Fahrenheit degrees.

Referring to FIG. 1, Curve A shows the relationship between the temperature of the molten solder and the time required for the removal of the insulation from the insulated wire while allowing soldering of the wire to the board. The graph is determined experimentally. The wire used for FIG. 1 is type HB polyurethane-coated wire although equivalent polyurethane wire types could also be used. Polyurethane will "dissolve" at temperatures in excess of 600°F similar to dried rosin flux and will bare the wire for soldering. By referring to the graph and especially to Curve A, it is shown that as the solder temperature is increased, the length of time that the wire need remain in the solder bath to remove the insulation decreases. For instance, if the solder temperature is raised to 750°F, Curve A shows that the wire must remain in the solder for two seconds to remove the insulation. If the solder temperature is raised to approximately 850°F, the wire would need to remain in the solder bath for less than one second to remove the insulation from the wire. Further if the solder temperature is lowered to 700°F for instance, the time required to remove the polyurethane insulation from the wire would be between three and four seconds. Thus there is a correlation between the temperature of the solder and the length of time necessary for polyurethane wire to be placed into the solder before the insulation is removed. Therefore, it appears that the highest practical temperature should be used along with the longest practical time for keeping the polyurethane wire into the molten solder. Adapting the insulated wire to a printed circuit board causes problems in that, if a too-high temperature and a too-long length of time is selected, the area is approached where the printed circuit board material will be damaged.

Still referring to the graph of FIG. 1, the top area of the graph is shown as unacceptable for the laminate of a printed circuit board. Curve B delineates this area. If the solder temperature and solder dwell time is selected to be in this area, the laminate material of the printed circuit board will be damaged. For instance, the laminate could be darkened because of burning the laminate material or the copper plating forming the pads on the printed circuit board would be lifted if a too-high of molten solder temperature is used and the printed circuit board is left in the molten solder for too long a time.

By experimentation using type HB polyurethane wire and a laminated printed circuit board made from a glass epoxy material, an acceptable range was determined as shown on FIG. 1.

It is within this range that the temperature of the solder must be maintained along with the length of time that the printed circuit board can remain in contact with the molten solder to accomplish the removal of the polyurethane insulation from the wire and solder the wire to the pads of the printed circuit board, both without damaging the glass epoxy laminate or the copper plating of the printed circuit board.

It is, or course, obvious that other types of insulation could be used on the insulated wire and that different laminate materials could be used for the printed circuit board which would allow for a different solder temperature and solder dwell time, possibly in an unacceptable area according to FIG. 1. The graph as shown in FIG. 1 should not be taken to limit the applicant's invention to the wire insulation and printed circuit board material used experimentally to determine the graph shown in FIG. 1. Other graphs using other insulation material and laminate material can be obtained by experimenting using different solder temperatures and different solder dwell times to find an acceptable range for the particular materials used.

Figure 2:
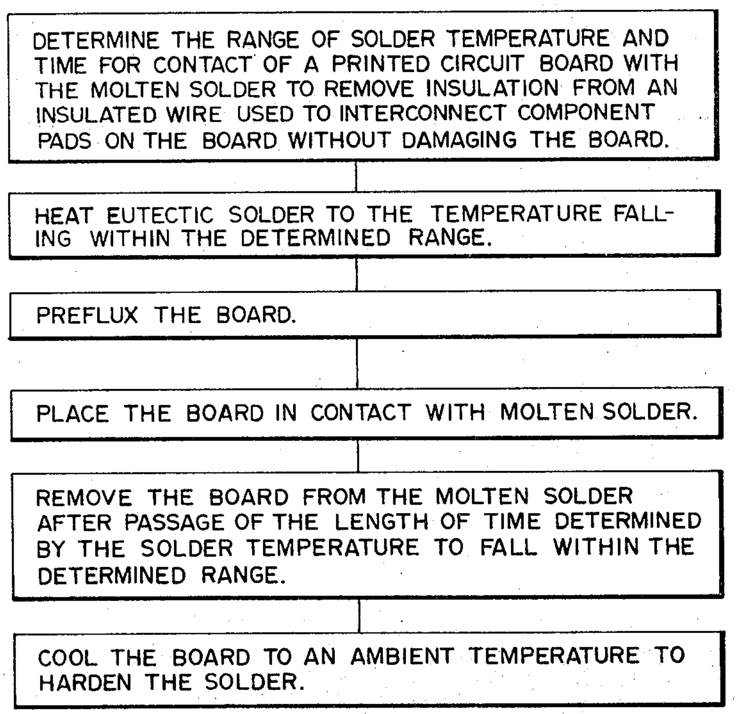
FIG. 2 shows the process steps required according to the present invention.

The process for the soldering of insulated wires onto printed circuit boards according to the preferred embodiment is shown in FIG. 2. The first step in the process according to FIG. 2 is to determine the range of solder temperature and time for contact of an insulated wire printed circuit board with the molten solder to remove insulation from the wire used to interconnect the component pads on the board without damaging the board. Thus the first step would be to experimentally determine the acceptable range as shown in FIG. 1 according to the material used such as the insulation on the insulated wire and the laminate material used for making the printed circuit boards.

Once the acceptable range is determined, eutectic solter is heated to a temperature falling within the determined acceptable range. The next step is to preflux the board to prevent oxidation of the copper plating forming the pads on the printed circuit board. The next step is to place the printed circuit board in contact with the molten solder. The board is then left into the molten solder for the time according to the experimentally determined acceptable range. Therefore, the next step is to remove the board from the molten solder after the passage of the length of time according to the experimentally determined graph and governed by the solder temperature to fall within the acceptable range on the graph. The next step is to cool the board to an ambient temperature to harden the solder. If required, the board could then be cleaned to remove any excess flux.

To show an acceptable mode of operation using the process according to the present invention, reference is made to FIG. 3 which shows a flow solder operation. In FIG. 3 the adaptation of the process according to the present invention to a standard wave soldering apparatus is shown. The standard wave soldering apparatus as shown in FIG. 3 comprises in general four processes and the apparatus necessary to accomplish these processes. The four processes are a flux process 12 shown as a flow fluxing apparatus, a heating process 14, a solder wave process 16, and a wash or cleaning process 18 shown as a flow fluxing apparatus, a heating process 14, a solder wave process 16, and a wash or cleaning process 18. In the mass soldering of printed boards according to the wave solder process, a conveyor 20 carries a printed circuit board 22 through the different processes. The printed circuit board 22 is placed on the conveyor 20 and carried by the conveyor through the different processes to the end. FIG. 4 is a cross-sectional view taken along the line 4—3 4 of FIG. 3 and shows a somewhat standard apparatus used to carry the printed circuit board 22 through the wave soldering machine.

Referring now to FIG. 4, the printed circuit board 22 is shown being supoported on outside edges by hangers 24 attached to the conveyor. The hangers 24 contact the printed circuit board 22 on the outer edges. To prevent the different processes of the wave soldering machine from lifting the printed circuit board out of contact with the process, a weight 26 is placed on top of the board 22. Beneath the printed circuit board 22 is represented a cross-sectional view of one of the processes, in this instance, the heating process 14. The board is therefore being preheated in readiness for the soldering process.

Referring again to FIG. 3, the steps required to accomplish a wave soldering of a printed circuit board according to the present invention will be given. The first step in preparing the standard wave soldering machine for soldering a printed circuit board according to the present invention is to heat the eutectic solder to a temperature determined according to the acceptable range as shown in FIG. 1. It is to be assumed that polyurethane is to be used for the insulation on the interconnecting wires of the printed circuit board and that the laminate material is glass epoxy. Thus an acceptable solder temperature using the polyurethane insulation on the wire and the glass epoxy printed circuit board according to FIG. 1 could be 800°F.

Still referring to FIG. 3, the next step in the wave soldering process is to determine the solder wave height and the entering and leaving angle of the printed circuit board 22 into the solder wave process. The next step is to set the conveyor speed to place the printed circuit board 22 into the wave solder process for the desired dwell time according to the acceptable range window determined experimentally as discussed previously. Since the wire insulation is polyurethane and the printed circuit board laminate is glass epoxy, the FIG. 1 graph can be used. Referring to FIG. 1, the solder dwell time or length of time that the printed circuit board is to contact the molten solder at 800°F to place the process in the acceptable range is between two and three seconds. Thus the conveyor speed must be set such that the printed circuit board 22 would be in contact with the wave solder process 16 for between two and three seconds.

The next step is to place the printed circuit board into the fixtures as shown in FIG. 4. This involved placing the weight 26 on top of the printed circuit board 22 and the combination into the hangers 24. The weight 26 and the printed circuit board 22 are placed along with the fixture onto the conveyor 20. The conveyor 20 carries the printed circuit board 22 through the machine operations of the wave soldering machine. In a standard wave soldering machine the first process is to flux the printed circuit board. As stated previously, the fluxing process 12 is necessary to prevent oxidation of the copper pads and the component leads prior to soldering.

As the printed circuit board 22 continutes down the conveyor the next step in the process is to preheat the board in the preheat process 14. The printed circuit board is preheated in order to insure good solder connections and also to prevent undue stresses in the printed circuit board that might occur if a cold printed circuit board is placed into contact with the high temperature of the solder in the wave solder process. The printed circuit board 22 then continues along the conveyor 20 to the wave solder process 16. As stated previously the printed circuit board 22 remains in contact with the molten solder in the wave soldering apparatus for a length of time determined by the conveyor speed. Thus the temperature of the solder must be held reasonably constant to the 800° while the solder dwell time must remain between two to three seconds in order to remain whithin the accpetable range window as shown in FIG. 1. The wave soldering apparatus melts the polyurethane insulation from the wire and solders the wire to the pads of the printed circuit board. A completed printed circuit board therefore emerges from the wave soldering process 16.

Still referring to FIG. 4, the next step encountered by the printed circuit board 22 in the wave soldering apparatus is a washing process 18 to remove any excess flux from the printed circuit board 22. AFter the washing process, the board 22 remains on the conveyor 20 until the end to allow for cooling the solder further to ambient temperature to harden the solder. The weight 26 and the printed circuit board 22 are then removed from the conveyor 20.

Figure 5:
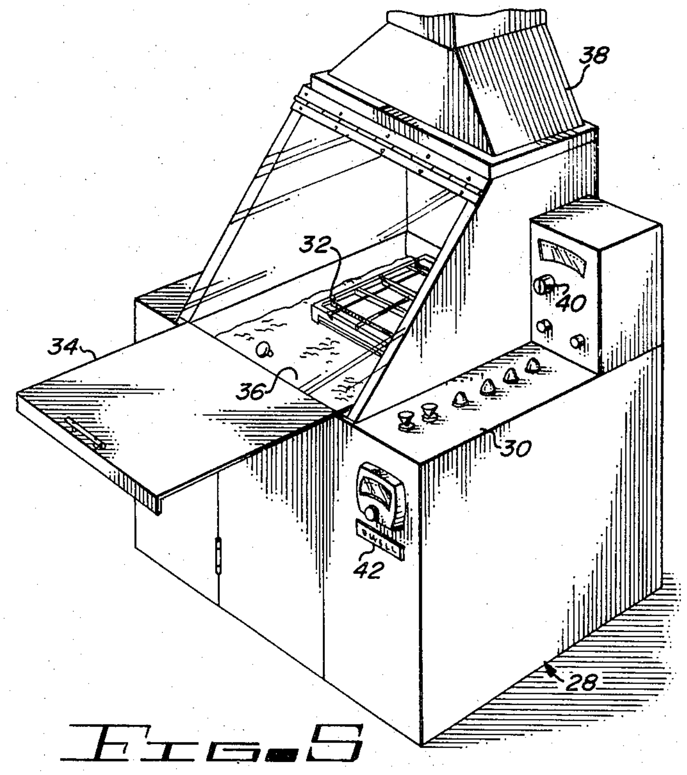
FIG. 5 is an isometric view of a dip soldering machine usable in the process according to the present invention.
Figure 6:
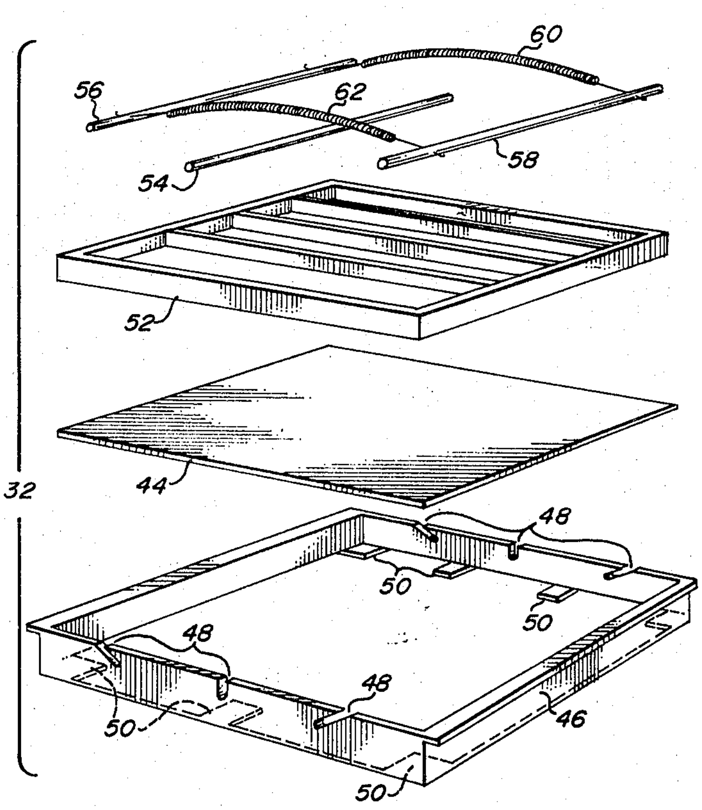
FIG. 6 is an exploded view of the assembly of a printed circuit board into a fixture for insertion into the dip soldering machine shown in FIG. 5.

Another apparatus which could be used with the process according to the present invention is a dip soldering machine 28 as shown in FIG. 5. Dip soldering apparatus is well known in the art and therefore only a very general description of the apparatus will be given. The dip soldering machine 28 shown in FIG. 5 comprises a control section 30 for controlling the descent of the fixture into a molten pool of solder. A holding fixture 32 is generally shown placed in position where the printed circuit board will contact the molten solder. A cover lid 34 is shown fully extended to expose a molten pool of solder 36. The cover lid includes a skimmer (not shown) which, when the cover lid 34 is pulled to its full open position, skims the tin oxide dross from the top of the molten solder pool 36. The dross is the contaminate including the separated tin and lead from the solder, copper from the printed circuit boards, and iron from the heating pot. The dross is removed from the top of the molten solder poll 36 to provide a clean solder bath for the printed circuit board. A heater (not shown) is included to provide sufficient controllable temperature for the molten solder. A vent 38 is also provided to carry out any fumes discharged by the molten solder. The control section 30 for the dip solder machine 28 includes a precise temperature control 40 and a dwell time control 42. The control section 30 contains standard apparatus which controls the rate of descent of the fixture holding the printed circuit board into the solder bath, the length of time that the fixture 32 remains in the solder bath (controlled by the dwell time control 42) and the ascent of the fixture 32 from the solder bath. The movement of the fixture 32 and an insulated wire printed circuit board 44 placed into the fixture 32 is shown in FIGS. 7*a* through 7*e*. An exploded view of the fixture 32 with the printed circuit board 44 is place for containing in the fixture 32 is shown in FIG. 6.

Before starting the process steps for a dip solder machine, the placement of the printed circuit board into the fixture will first be explained. Referring to FIG. 6, the holding fixture 32 comprises a frame 46 having notches 48 formed in two opposite sides of the frame 46 and extensions 50 protruding into the open section of the frame 46. The extensions 50 contact the edges of the printed circuit board 44 to hold the printed circuit board 44 within the frame 46. A stiffening frame 52 is then placed over the printed circuit board 44 to provide support to keep the printed circuit board 44 from buckling due to the heat of the molten solder bath. A center rod 54 is then placed over the stiffening frame 52 and two other rods 56 and 58 having two springs 60 and 62 connecting the rods 56 and 58 are placed into the notches 48 in the frame 46. The springs 60 and 62 provide a tension to pull the two rods 56 and 58 together and, when placed within the frame 46, provide a downward tension against the stiffening frame 52 to keep the printed circuit board 44 from coming out of the frame 46 and to keep the printed circuit board 44 from buckling.

Figure 7A:
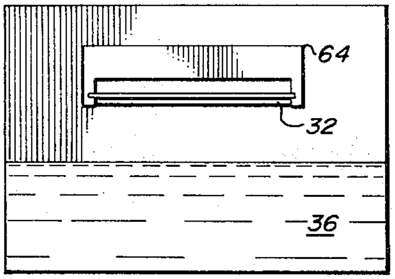
FIGS. 7*a*—7*e* show the steps taken by the machine to accomplish the soldering process in the dip soldering machine shown in FIG. 5.
Figure 7B:
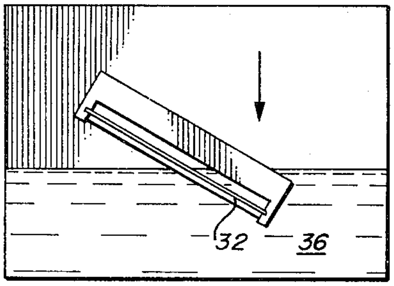
Figure 7C:
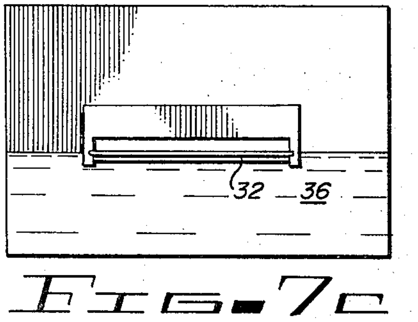

The process through the machine cycle can be shown by referring to FIGS. 7*a* to 7*e*. FIGS. 7*a* to 7*e* show the printed circuit board 44 in place in the holding fixture 32 and the fixture being held by an apparatus holder 64. FIGS. 7*a* to 7*e* show a frontal view of the machine steps carrying the fixture 32 with the printed circuit board intact into and out of the molten pool of solder or solder bath 36. In FIG. 7*a* the fixture 32 is shown in the top-most position for the preheat step for instance. FIG. 7*b* shows the fixture 32, still holding the printed circuit board, entering the molten pool of solder 36 at an angle to allow for even heating of the board. FIG. 7*c* shows the fixture 32 positioned essentially floating and printed circuit board on the molten solder. This is the dwell time of the dip solder apparatus and is the critical time determined by the acceptable range for the solder temperature, the material forming the insulation of the wire, and the laminate structure of the printed circuit board.

Figure 7D:
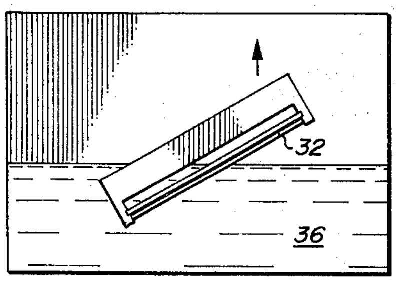
Figure 7E:
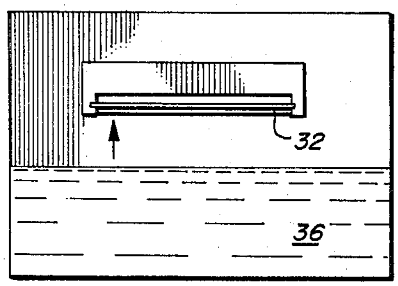

FIG. 7*d* shows the step of the machine where the printed circuit board and the fixture 32 are removed from the solder bath 36 at an angle. The printed circuit board is removed from the solder bath 36 at an angle to prevent or to minimize bridging the icicling of the solder. FIG. 7*e* shows the fixture 32 holding the printed circuit board returned to the top position for hardening the solder in the cooling process.

Referring now to FIGS. 5, 6, and 7*a* to 7*e*, the process according to the present invention for use in a dip solder mass soldering apparatus will be given. The first step is to turn on the dip soldering apparatus to start heating the eutectic solder. The next step is to set the dwell time control 42. For the preferred embodiment a solder temperature of 800°F and a solder dwell time of between two to three seconds (see FIG. 1) will be used to keep the process within the acceptable range of operation to melt the polyurethane insulation from the wire while still preventing damage to the glass epoxy printed circuit board.

The next step is to preflux the printed circuit board by covering the board with a solder flux. The printed circuit board 44 is then placed into the fixture 32 as shown in FIG. 6. The fixture 32 is then placed into the dipping apparatus holder 64, see FIG. *7a*.

The board is then preheated by leaving the board in the machine suspended above the solder bath for a short length of time, generally three minutes, FIG. *7a*. The cover 34 is the pulled forward and the skimmer will skim the dross from the molten solder pool 36. The next step is to cycle the machine.

During the cycling of the machine the machine performs the following steps. At the start of the cycle, the control unit actuates the apparatus holder 64 to tilt and slotly lower the fixture 32 containing the board at about a 15 to 20 degree angle into the molten solder. The board is entered into the solder bath 36 at the angle, FIG. *7b*. The control section 30 then levels the holder 64 and the fixture 32 to the horizontal position to place the entire bottom section of the printed circuit board into the dip solder bath, FIG. *7c*. The dwell timer 42 then starts and keeps the printed circuit board into the molten solder pool 36 for a period of time according to the acceptable range of the window as shown in the graph of FIG. 1 Since the temperature of the solder was determined to be 800°F, the dwell timer 42 will be preset to hold the printed circuit board into the solder bath for a length of time of between two to three seconds. After the dwell time has expired, the control unit 30 then raises the board above the molten solder bath 36 at approximately a 15 to 20 degree angle, FIG. *7d*. The apparatus holder 64 then raises the fixture 32 upward above the solder bath 36 and the cycle ends when the fixture 32 reaches the upper most travel. FIG. *7e*.

The board is then cooled by leaving the board in the dip machine apparatus for a length of time to allow the solder to harden, generally about three minutes. The fixture 32 with the board is then removed from the apparatus holder 64. The board is then allowed to cool further until an ambient temperature is reached, leaving the printed circuit board 44 within the fixture 32. The printed circuit board 44 is then removed from the fixture 32 and the board 44 is cleaned to remove any excess flux from its surface.

Thus what has been described is a mass interconnection process for joining randomly wired printed circuit boards containing insulated wire used for circuitry interconnection between the pads of a printed circuit board. Eutectic solder held at a higher than normal temperature to remove the insulation from the insulated wires and to solder and form all of the interconnections at one time on a standard printed circuit board has now been fully described. The dwell time and the temperature of the solder are the critical parameters of this invention. The use of polyurethane insulation and glass epoxy material for the printed circuit board as well as the dip apparatus and wave soldering techniques described herein should not be taken to limit this invention. It is obvious that other insulation could be used on the wire and other materials could be used for the printed circuit board without departing from within this invention.

The principles of the invention have now been made clear in two illustrative embodiments. There will be immediately obvious to those skilled in the art many modifications of structure, arrangement, proportions, the elements, materials and components used in the practice of the invention. For instance polyurethane is included as a type of material which could comprise the insulation on the interconnecting wire on the printed circuit board. It is obvious that polyButbar or Formbar materials could be used as insulation on the interconnecting wires. For these materials different solder temperature versus dwell time curves would have to be drawn via experimentation to determine the acceptable range of operation. These materials could be used without departing from within the scope of this invention. Also the preferred embodiment discloses the use of glass epoxy for the laminates of the printed circuit board. It is further obvious that the material forming the printed circuit board could be other types of plastics. The appended claims are therefore intended to cover and embrace any such modifications, within the limits only of the true spirit and scope of the invention.

What is claimed is:

1. A process for mass soldering high-temperature-insulated-wire to printed circuit boards wherein the boards are prefluxed and preheated, comprising the steps of:

experimentally determining a temperature-time relationship which results in the removal of the high-temperature insulation from the wire;

experimentally determining a temperature-time relationsip which establishes limits at which degradation of the printed circuit board commences;

determining a range of molten solder temperature and a corresponding dwell time during which the high-temperature-insulated-wire circuit board can be in contact with the molten solder to effect removal of the insulation and soldering of the wire without damaging the printed circuit board;

heating solder to a temperature which lies within the determined range;

placing the prefluxed printed circuit board with high-temperature-insulated-wire attached in contact with the heated, molten solder;

removing the board from the molten solder after the passage of the dwell time determined to be necessary to melt the high-temperature insulation and solder the wire; and cooling the removed board to harden the solder.

2. A process for mass soldering high-temperature-insulated-wire to printed circuit boards by the use of a dip soldering machine comprising the steps of:

experimentally determining temperature-time relationships which result in removal of the high-temperature insulation from the wires and which establish limits at which damage to the printed circuit board begins;

determining a range of molten solder temperature and a corresponding dwell time during which the high-temperature-insulated-wire circuit board can be in contact with the molten solder to effect removal of the insulation and soldering of the wire without damaging the board;

setting controls on the dip soldering machine to heat solder to a temperature which lies within the determined range;

setting a dwell timer on the dip soldering machine to control the dwell time to fall within the determined acceptable range;
prefluxing the board;
placing the prefluxed board in a fixture for usage in the dip solder machine;
placing the fixture with the board into a holder in the dip solder machine;
preheating the board in the placed fixture;
skimming the dross from the molten solder;
cycling the dip soldering machine to solder the board by dipping the board into the skimmed molten solder;
removing the board from the molten solder after the passage of the dwell time determined to be necessary to melt the high-temperature insulation and solder the wire;
cooling the soldered board;
removing the fixture having the cooled board attached thereto;
further cooling the board with the fixture attached;
removing the cooled board from the fixture; and
cleaning the removed board.

3. A process for mass soldering high-temperature-insulated-wire to printed circuit boards by the use of a wave soldering machine comprising the steps of:
experimentally determining temperature-time relationships which result in removal of the high-temperature insulation from the wires and which establish limits at which damage to the printed circuit board begins;
determining a range of molten solder temperature and a corresponding dwell time during which the high-temperature-insulated-wire circuit board can be in contact with the molten solder to effect removal of the insulation and soldering of the wire without damaging the board;
heating solder to a temperature which lies within the determined temperature range;
setting the wave soldering machine for the correct solder wave height and for the desired angle at which the printed circuit board enters and leaves the solder wave;
setting a conveyor speed on the wave soldering machine so that the printed circuit board is placed in the molten solder wave for the desired dwell time;
placing the board in a fixture for use on the wave solder machine;
depositing the fixture with the board on the conveyor;
cycling the deposited board through a complete operation of the wave soldering machine to melt the high-temperature insulation and solder the wires to the board;
removing the soldered board from the conveyor after the cycle is completed; and
cooling the removed board to ambient temperature.

* * * * *